United States Patent [19]

Anderson et al.

[11] Patent Number: 4,591,740

[45] Date of Patent: May 27, 1986

[54] MULTIPLE INPUT PORT CIRCUIT HAVING TEMPERATURE ZERO VOLTAGE OFFSET BIAS MEANS

[75] Inventors: Thomas R. Anderson; Howard L. Skolnik; Bruce C. Trump, all of Tucson, Ariz.

[73] Assignee: Burr-Brown Corporation, Tucson, Ariz.

[21] Appl. No.: 470,549

[22] Filed: Feb. 28, 1983

[51] Int. Cl.[4] .................. H03K 3/26; H03K 17/56; G06G 7/12

[52] U.S. Cl. .................. 307/310; 307/490; 307/296 R; 307/243

[58] Field of Search ........ 307/310, 490, 491, 240-243, 307/296 R

[56] References Cited

U.S. PATENT DOCUMENTS

| | | | |
|---|---|---|---|
| 3,092,732 | 6/1963 | Milford | 307/241 |
| 3,166,679 | 1/1965 | Paufve | 307/241 |
| 3,526,785 | 1/1970 | Biri | 307/243 |
| 4,037,118 | 7/1977 | Sieborger et al. | 307/243 |
| 4,198,581 | 4/1980 | Ahmed | 307/310 |
| 4,349,750 | 9/1982 | Geurts | 307/243 |

*Primary Examiner*—Stanley D. Miller
*Assistant Examiner*—B. P. Davis
*Attorney, Agent, or Firm*—Harry M. Weiss

[57] ABSTRACT

A plurality of input stages having their outputs connected to provide differential currents to a load. When a bias current flows through a selected one of the input stages, the differential currents are provided in response to a differential signal provided to the selected stage. The input stages are each comprised of a pair of emitter-coupled transistors. Resistors are connected in series with the emitters of the transistors and the bias current is directly proportional to absolute temperature. The resistors may be adjusted to cause the offset voltages of the input stages to substantially equal zero at all temperatures.

8 Claims, 5 Drawing Figures

MULTIPLE INPUT PORT CIRCUIT HAVING TEMPERATURE ZERO VOLTAGE OFFSET BIAS MEANS

BACKGROUND OF THE INVENTION

1. Field of the Invention

This invention relates generally to electronic circuits having a plurality of input ports and, more particularly, to a circuit that is responsive to a selected one of a plurality of input signals.

2. Description of the Prior Art

In a typical electronic process control system, a plurality of sensors provide electrical signals that are each representative of a specific physical phenomena. One sensor may, for example, provide a voltage that is proportional to temperature. Another sensor may provide a voltage that is proportional to humidity, etc.

In one type of electronic process control system, the electrical sensor signals are applied to a central processor via a multiplexer. The multiplexer is a plurality of switches that are operable to cause a selected one of the sensor signals to be provided to the processor. Accordingly, in this type of system, a sensor signal path from a sensor to the processor includes the multiplexer.

The multiplexer is often comprised of either relays or field effect transistor (FET) switches. A relay is typically large, costly and short lived, in comparison to an FET switch. The FET switch, however has an "on" state that inserts an undesirably high resistance into the sensor signal path. Additionally, the FET switch has an "off" state that inserts a leakage current into the sensor signal path. The undesirable resistance and the leakage current both vary with changes in ambient temperature. Moreover, not all FET switches can be used when the sensor signal is comprised of voltages in a range of $+10$ to $-10$ volts, a usual input voltage range in electronic process control systems.

In another type of electronic process control system, all of the sensor signals are provided to preamplifiers. Amplified sensor signals from the preamplifiers are applied to the processor via the multiplexer. Accordingly, an amplified sensor signal has a signal path from the output of a preamplifier to the processor via the multiplexer. Typically, this type of system is not suitable for processing low level signals because the preamplifier generates undesired error signals. The preamplifier generates undesired error or offset signals. The error and offset signal vary as a function of temperature. The error and offset signals may be reduced for a given preamplifier by a temperature compensation circuit. Duplicating typical offset or error correction circuits becomes undesirably complex where many channels are used. The preamplifiers also draw input bias current when not selected. This causes undesirable interaction when the inputs of the preamplifiers are connected together to share inputs or feedback. Circuitry to selectively remove power for an entire preamplifier can become undesirably complex.

Accordingly, there is a need for a new circuit that is operable over a wide range of ambient temperature to provide one of a plurality of input signals to a load without generating the error signals. Additionally, it is desired that the new circuit be responsive to a range of input signals commonly encountered in electronic process control systems. Also the new circuit should have inputs that draw no input current and exhibit very high input impedance when not selected.

SUMMARY OF THE INVENTION

An object of the present invention is to provide an improved circuit that is responsive to a selected one of a plurality of input signals.

According to another object of the present invention, one of a plurality of amplifiers is operable to provide an input signal to a load in response to a flow of bias current therethrough.

A still further object of the present invention is to economically provide an electronic circuit responsive to a selected one of a plurality of input signals without either signal loss through a switching circuit or leakage through the switching circuit.

Additionally, still another object of the invention is to provide an improved circuit that is responsive to a selected one of a plurality of input signals and that is usable over a large range of ambient temperatures. The input signals may be comprised of voltages within a range commonly encountered in electronic process control systems.

Other objects, features and advantages of the present invention will be apparent from the following, more particular, description of the preferred embodiment of the invention as illustrated in the accompanying drawing.

DESCRIPTION OF THE PREFERRED EMBODIMENT

In accordance with one embodiment of this invention, apparatus for providing differential signals to a load, comprises first input stage means for providing the differential signals to the load in response to a first differential input signal and a flow of a first bias current through said first means; second input stage means for providing the differential signals to the load in response to a second differential input signal and a flow of a second bias current through the second means; and biasing means for providing the first and second bias currents.

In accordance with another embodiment of this invention, in the method of providing differential output signals in response to first and second differential input signals, the steps of providing first and second differential input stages, each of which is operable to provide the differential output signals; applying the first and second input signals respectively to the first and second stages; and supplying a bias current to a selected one of the input stages to cause the differential output signals to be provided by the selected input stage.

DESCRIPTION OF THE SPECIFICATION

Figure 2:
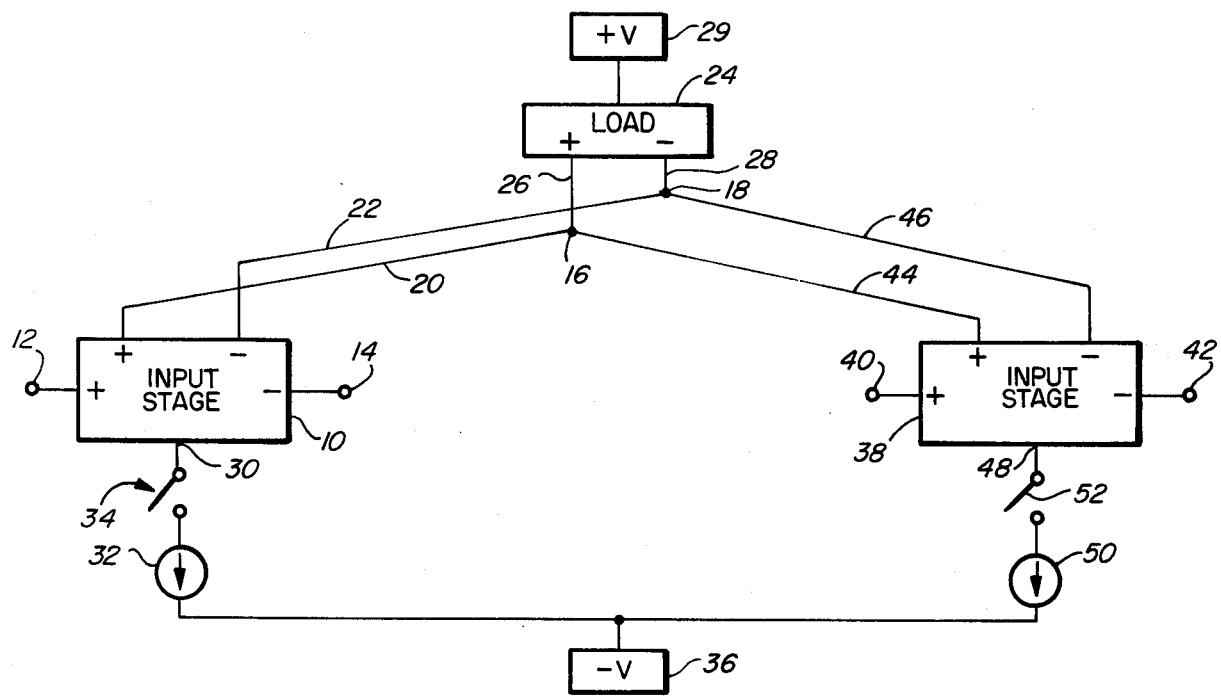
FIG. 2 is a schematic block diagram illustrative of a biasing technique for the embodiment of the invention.

With reference to FIG. 2, an input stage 10 has an inverting input and a non-inverting input respectively connected to terminals 14, 12. The terminals 12, 14 are connected to a source (not shown) that provides a first pair of input voltages. As explained hereinafter, the first pair of input voltages are a differential input signal.

The input stage 10 additionally has a non-inverted output and an inverted output respectively connected to output terminals 16 and 18 through signal lines 20 and 22. The output terminal 16 is connected to a first terminal of a load 24 through a signalline 26. The output terminal 18 is connected to a second terminal of the load 24 through a signal line 28. The load 24 is additionally connected to a positive voltage source 29. As explained hereinafter, the input stage 10 is operable to provide differential currents to the load 24 when a bias current flows through the stage 10.

The input stage 10 has a bias terminal 30 that is connectable to one terminal of a current source 32 by means of a switch 34. The current source 32 is connected to a negative voltage source 36. The input stage 10, the switch 34 and the current source 32 are all connected together in series.

When the switch 34 is closed, the current source 32 provides a first stage bias current that flows from the terminal 30 of the input stage 10 to the voltage source 36. Moreover, the first stage bias current flows from the voltage source 29 through the load 24 to the input stage 10 via the lines 20, 26 and the lines 22, 28. When the switch 34 is open, here is no flow of the first stage bias current. Current sources are well known to those skilled in the semiconductor electronics art and various current sources can be used for the current source 32.

It should be understood that the first stage bias current substantially equals the sum of the currents that flow through the lines 20, 26, and the lines 22, 28. When equal input voltages are provided to the terminals 12, 14, of the input stage 10, one half of the first stage bias current flows through the lines 20, 26 and the other half flows through the lines 22, 28, whereby the difference between the current in the lines 20, 26 and the lines 22, and 28 is zero. However, when the input voltage provided to the terminal 12 is greater than the input voltage provided to the terminal 14, a greater amount of the bias current flows through the lines 28, 22 than the lines 20, 26. Correspondingly, when the input voltage provided to the terminal 14 is greater than the input voltage provided to the terminal 12, a greater amount of the bias current flows through the lines 20, 26 than the lines 22, 28. Moreover, the difference between the currents that flow through the lines 20, 26, and the lines 22, 28 is proportional to the difference between the voltages comprising the first pair of input voltages. Hence, the input stage 10 is responsive to the difference in the input voltages provided to the terminals 12, 14. Thus, the input voltage provided to the terminals 12, 14 is a differential input signal. From the explanation given hereinbefore, the input stage 10 is operable to provide differential currents to the load 24 when the switch 34 is closed.

A second input stage 38, similar to the input stage 10, has inverting and non-inverting inputs respectively connected to input terminals 42, 40. The terminals 40 42 are connected to a source (not shown) that provides a second pair of input voltages whereby a differential input signals is provided to the input stage 38.

The input stage 38 additionally has non-inverted and inverted outputs respectively connected to the terminals 16, 18 through respective signal lines 44, 46. A bias terminal 48 of the input stage 38 is connectable to a current source 50 by means of a switch 52. The current source 50 is also connected to the voltage source 36. Therefore, the input stage 38, the switch 52 and the current source 50 are all connected together in series. The current source 50 and the switch 52 are respectively similar to the current source 32 and the switch 34.

Similar to the input stage 10, the input stage 38 is operable to provide differential currents to the load 24 when the switch 52 is closed. It should be understood that one, but not both of the switches 34, 52 are closed at any given time.

It should be appreciated that additional input stages, if desired, may be used to provide differental currents to the load 24. When, for example, five input stages are used, only one of the five input stages provides differential currents to the load 24 at any given time. If desired, in some applications, more than one input stage can be selected. As explained hereinafter, when a single pole switch with multiple contact is used as an alternative to the switches 34, 52, only the current source 32 is used to provide the bias current to a plurality of input stages.

Figure 2A:
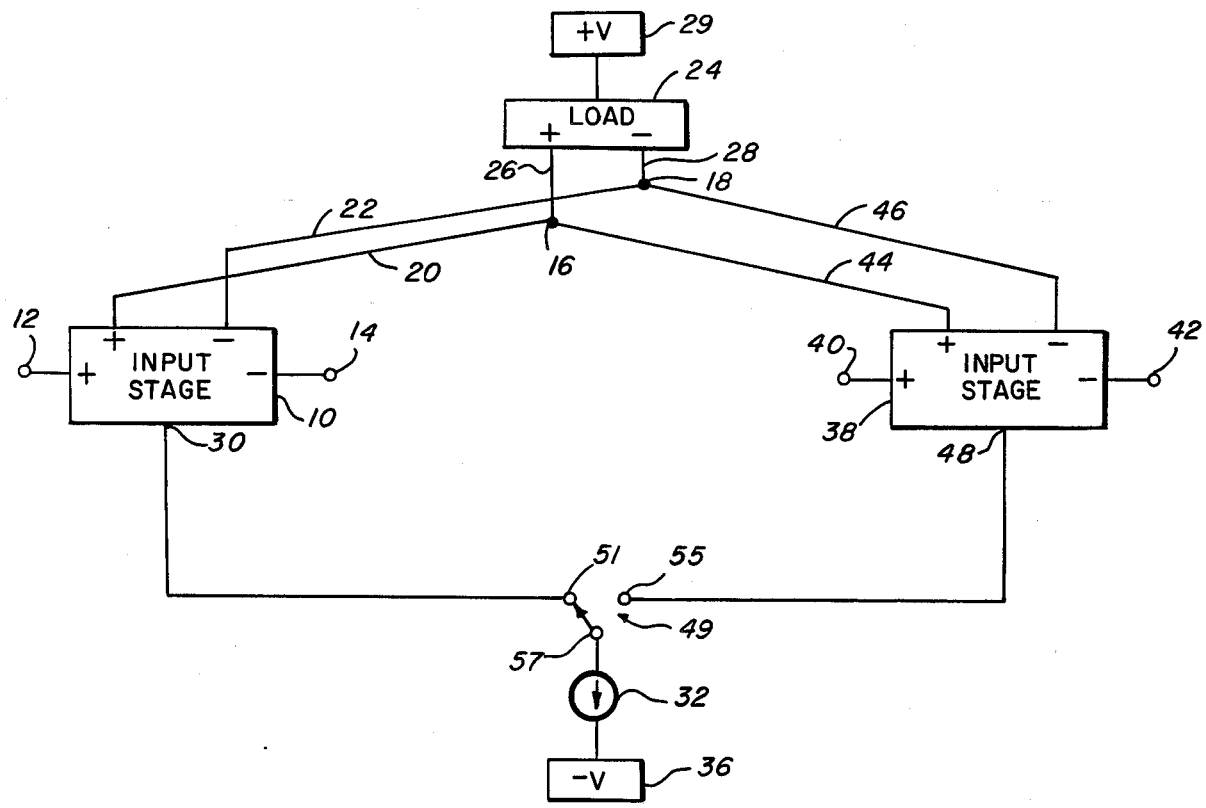
FIG. 2A is a schematic block diagram illustrative of an alternative to the biasing technique of FIG. 2.

As shown in FIG. 2A, the stages 10, 38 are connectable to the current source 32 through the switch 49. More particularly, the terminals 30, 48 are respectively connected to contacts 51, 55 of the switch 49. A pole 57 of the switch 49 is connected to one terminal of the current source 32, the other terminal being connected to the voltage source 36. Hence, the switch 49, the current source 32 and the voltage source 36 are all connected in series.

When the switch 49 is thrown to provide a connection between the pole 57 and the contact 51, the first stage bias current is provided to the stage 10. Correspondingly, when the switch 49 is thrown to provide a connection between the pole 57 and the contact 55, a second stage bias current is provided to the stage 38.

Figure 3:
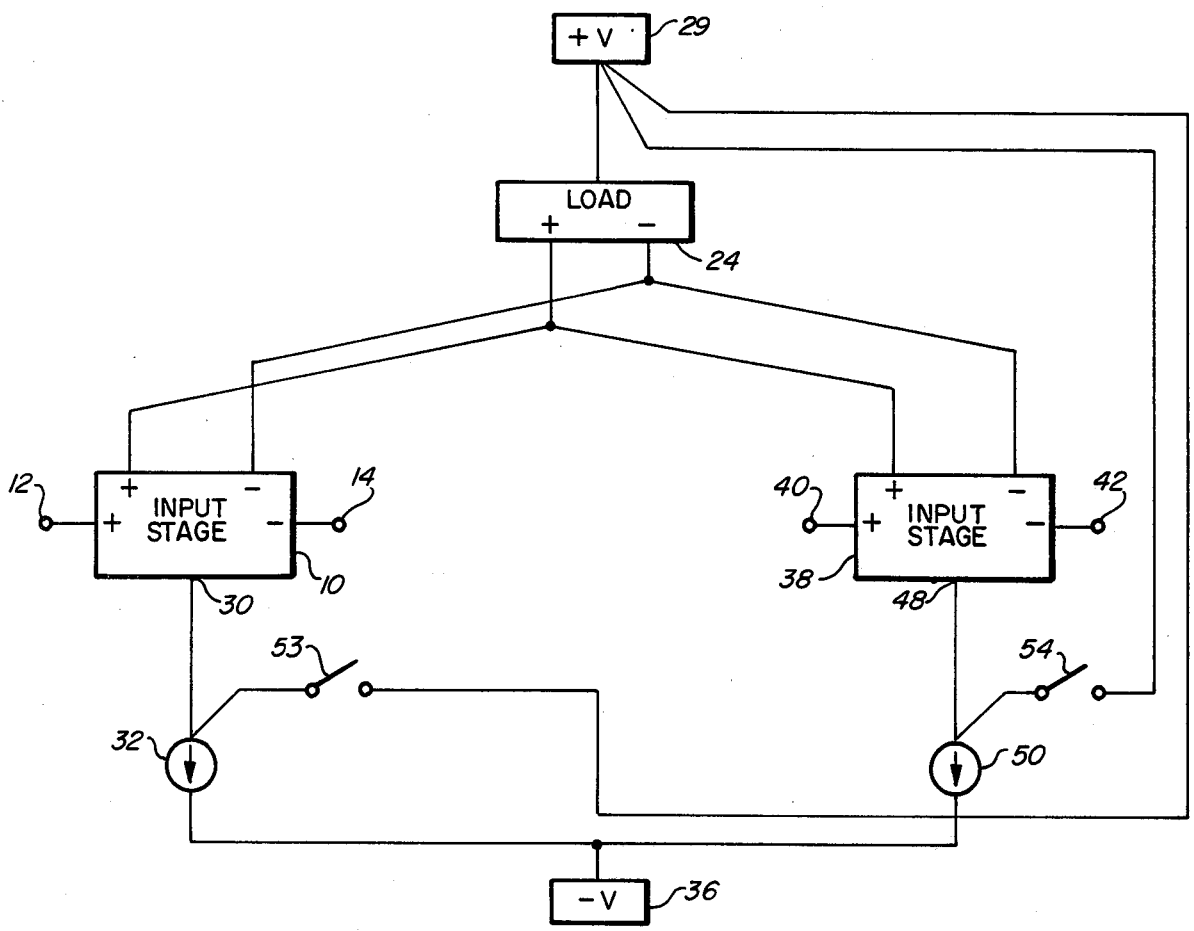
FIG. 3 is a schematic block diagram illustrative of another biasing technique (similar to FIG. 2)

As shown in FIG. 3 (which is similar to FIG. 2 and includes the same reference numbers to designate the same components), the bias currents may be diverted from the input stages 10, 38, thereby obviating an interruption of current flow through the current sources 32, 50. More particularly, the load 24 is connected to the input stages 10, 38 and to the voltage source 29 as described in connection with FIG. 2. Similarly, the current sources 32, 50 are connected to the voltage source 36 as described in connection with FIG. 2. However, in FIG. 3, the terminal 30 is directly connected to the current source 32. Additionally, the current source 32 is connectable to the voltage source 29 by means of a switch 53. When the switch 53 is open, the current source 32 provides the first stage bias current in a manner similar to that described hereinbefore. When the switch 53 is closed, the first stage bias current flows from the voltage source 29 through the switch 53 to the current source 32, whereby the first stage bias current is diverted from the load 24 and the input stage 10.

Correspondingly, the current source 50 is connectable to the voltage source 29 through a switch 54. The switch 54 is operable to divert current from the load 24 and the input stage 38 in a manner similar to that described in connection with the switch 53.

In accordance with the explanation given hereinbefore, a plurality of pairs of input voltages may respectively be provided to a plurality of input stages. A selected one of the input stages is operable to provide differential signals to a load in response to an operation of a switch.

A second aspect of the present invention relates to utilization of a pair of emitter coupled transistors as an input stage. More particularly, the transfer characteristics of the input stage with the emitter coupled transistors are substantially independent of changes in ambient temperature.

Figure 4:
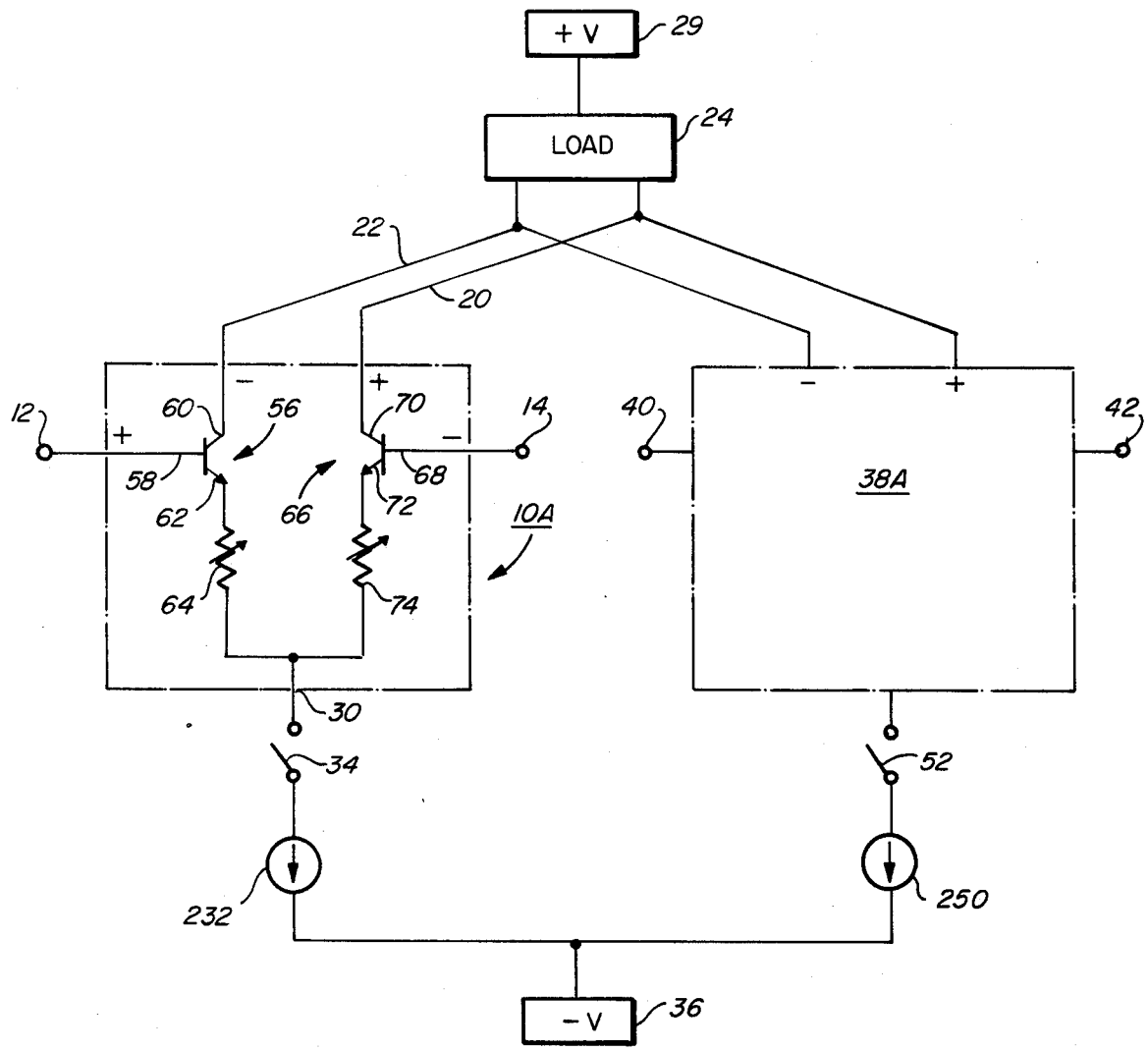
FIG. 4 is a schematic block diagram, similar to FIG. 2, illustrative of a technique and arrangement for reducing the offset voltage of an input stage.

As shown in FIG. 4, a circuit arrangement similar to that of FIG. 2, includes an input stage 10A (in place of the input stage 10) and an input stage 38A (in place of the input stage 38) current sources 232, (in place of the current source 32) and a current source 250 (in place of the current source 50). In all other respects, FIG. 4 is the same as FIG. 2. For reasons fully explained hereinafter, the current sources 232, 250 are of a type that provide current directly proportional to their absolute temperature.

The input stage 10A includes a pair of bipolar transistors 56, 66 connected to form an emitter coupled differential input stage. Differential input stages are well known to those skilled in the semiconductor electronics art.

The transistor 56 has its base 58 and collector 60 respectively connected to the terminal 12 and the line 22. The emitter 62 of the transistor 56 is connected to the terminal 30 through an adjustable resistor 64 whereby the emitter 62 and the adjustable resistor 64 are connected in series.

The input stage 10A additionally includes the transistor 66 with the base 68 and the collector 70 thereof respectively connected to the terminal 14 and the line 20. The emitter 72 of the transistor 66 is connected to the terminal 30 through an adjustable resistor 74 whereby the emitter 72 and the adjustable resistor 74 are connected in series. As explained hereinafter, the adjustable resistors 64, 74 are adjusted to values to make the transfer characteristics of the input stage 10A substantially independent of the changes in the ambient temperature.

Typically, slight differences in construction cause the transistors 56, 66 to have respective characteristics that differ from each other. Accordingly, what is known as an offset voltage must be applied to the terminals 12, 14 to cause the currents in the lines 20, 22 to equal each other. Since the collector and emitter currents of most transistors are substantially equal, the offset voltage is in accordance with an offset voltage relationship which is given as:

$$Vos = Vbe1 = Vbe2 + (Ie1)(R1) - (Ie2)(R2)$$

where
Vos is the offset voltage;
Vbe1 is the base-emitter voltage of the transistor 56;
Vbe2 is the base-emitter voltage of the transistor 66;
Ie1 is the current that flows from the emitter 62;
Ie2 is the current that flows from emitter 72;
R1 is the resistance of the adjustable resistor 64; and
R2 is the resistance of the adjustable resistor 74.

According to one aspect of the invention, the adjustable resistors 64, 74 are adjusted to cause the offset voltage to equal zero at any ambient temperature, whereby the offset voltage relationship reduces to a zero-offset relationship which is given as:

$$0 = \Delta Vbe - Ie1 \cdot \Delta R$$

where:
$\Delta$ Vbe is the difference between the base-emitter voltage of the transistors 56, 66; and
$\Delta$ R is the difference between the resistance values of the adjustable resistors 64, 74.

It is well known that when a pair of transistors, such as the transistors 56, 66, are connected to form the emitter coupled differential input stage, the difference between their base emitter voltages are in accordance with a relationship which is given as:

$$\Delta Vbe = (KT/q) \cdot \ln(D)$$

where:
K is Boltzman's constant;
T is absolute temperature;
q is the charge of an electron; and
$$D = (Ie1/Is1)/(Ie2/Is2)$$

where:
Is1 is the saturation current of the base-emitter junction of the transistor 56, and Is2 is the saturation current of the base-emitter junction of the transistor 66.

As is well known to those skilled in the art, the saturation current of a semiconductor junction is the current that flows therethrough when zero volts is applied to the semiconductor junction.

The zero offset relationship and the base-emitter voltage relationship can be combined to provide a temperature dependence relationship, which is given as:

$$(KT/q) \cdot \ln(D) = Ie1 \cdot \Delta R$$

It should be appreciated that the terms, K, q, D and $\Delta$ R are all temperature independent constants. Since the term, T, is the only temperature varying term in the left hand side of the temperature dependence relationship, the left hand side of the temperature dependence relationship has a value that varies in direct proportion to absolute temperature. Since the term, Ie1, is the only term in the right hand side of the temperature dependence relationship that may vary, Ie1 (Ie2) must be made to vary in direct proportion to absolute temperature for the zero-offset relationship to be maintained at substantially all temperatures of interest. According to the present invention, when the adjustable resistors 64, 74 are adjusted to cause the offset voltage to equal zero at any temperature and the current source 232 provides a first stage bias current directly proportional to absolute temperature, the offset voltage equals zero at all temperatures of interest. Current sources that provide a current directly proportional to absolute temperature are well known in the semiconductor electronics art.

Figure 1:
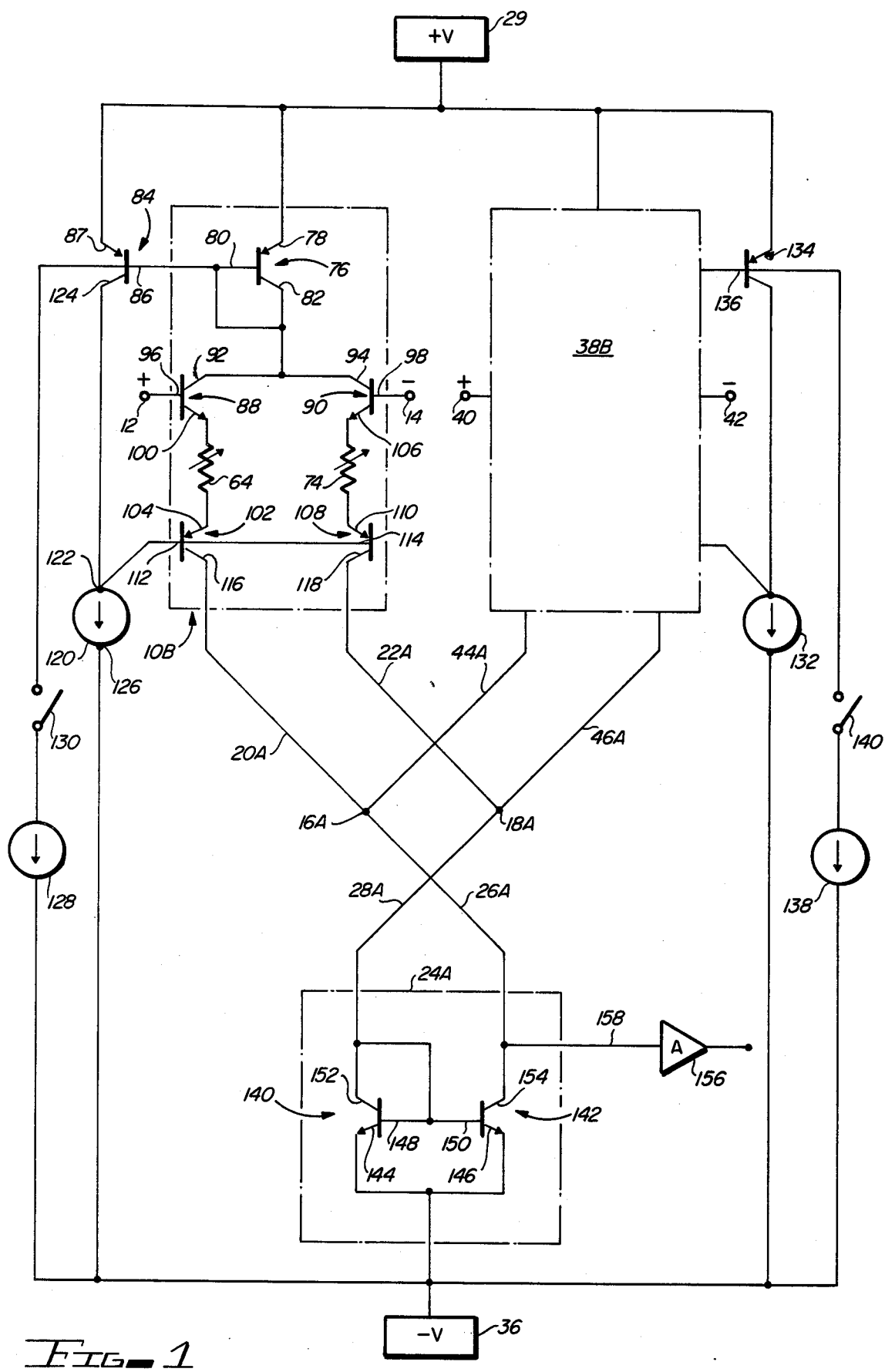
FIG. 1 is a schematic block diagram of the preferred embodiment of the present invention.

As shown in FIG. 1, a first input stage 10B includes an PNP transistor 76 that has its emitter 78 connected to the voltage source 29. An important feature of the input stage 10B is that it provides a very high input impedance when no bias current flows therethrough. Additionally, the base 80 and the collector 82 of the transistor 76 are both connected to a PNP transistor 84 at the base 86 thereof. The transistors 76, 84 are similar to each other. Similar to the transistor 76, the emitter 87 of the transistor 84 is connected to the voltage source 29. As explained hereinafter, a current greater or equal to the first stage bias current, may flow through the transistor 84.

The collector 82 of the transistor 76 is additionally connected to NPN transistors 88, 90 at their respective collectors 92, 94. The respective bases 96, 98 of the transistors 88, 90 are connected to the terminals 12, 14 in a manner similar to the connection of the bases 58, 68 (FIG. 4). The emitter 100 of the transistor 88 is connected to a PNP transistor 102 at its emitter 104 through the adjustable resistor 64, whereby the emitter 100, the adjustable resistor 64 and the emitter-base junction of the transistor 102 are all connected in series. Correspondingly, the emitter 106 of the transistor 90 is connected to a PNP transistor 108 at its emitter 110 through the adjustable resistor 74, whereby the emitter 106 the adjustable resistor 74 and the emitter-base junction of the transistor 108 are all connected in series. The respective bases 112, 114 of the transistors 102, 108 are connected together. Accordingly, the emitters 100, 106 of the respective transistors 88, 90 are coupled together via the adjustable resistors 64, 74 and the emitter-base junctions of the transistors 102, 108.

The collector 116 of the transistor 102 is connected to an output terminal 16A through a signal line 20A. Correspondingly, the collector 118 of the transistor 108 is connected to an output terminal 18A through a signal line 22A. The terminals 16A, 18A are respectively connected to a load through signal lines 26A, 28A, whereby the stage 10B is connected to the load 24A. The load 24A is described more fully hereinafter.

The bases 112, 114 of the respective transistors 102, 108 are both connected to a current source 120 at a terminal 122 thereof. The terminal 122 is additionally connected to the collector 124 of the transistor 84. In this embodiment, a known current that is directly proportional to absolute temperature flows into the current source 120 via the terminal 122. The known current flows out of the current source 120 via a terminal 126 thereof to the voltage source 36.

A small fraction of the known current flows from the bases 112, 114 of the respective transistors 102, 108 thereby forward biasing the base-emitter junctions of the transistors 102, 108 and causing the first stage bias current to flow through the input stage 10B to the load 24A. All but the small fraction of the known current flows from the collector 124 of the transistor 84.

It should be understood that the first stage bias current flows through the emitter-base junction of the transistor 76, thereby causing a forward bias voltage between the emitter 78 and the base 80 thereof. Since the emitters 78, 87 of the respective transistors 76, 84 are both connected to the voltage source 29 and the bases 80, 86 are connected together, the forward bias voltage is applied to the emitter-base junction of the transistor 84. Because the transistors 76, 84 are similar, the emitter currents of the transistors 76, 84 are substantially equal, whereby the first stage bias current substantially equals the known current. Because the emitter 100, 106 are coupled and the known current is directly proportional to absolute temperature, the temperature dependence and zero offset relationships are both applicable to the stage 10B. The differential currents are provided by the stage 10B to the load 24A in a manner similar to that described in connection with FIG. 4.

The bases 80, 86 of the respective transistors 76, 84 are additionally connected to one terminal of a diverting current source 128 through a switch 130. The other terminal of the current source 128 is connected to a voltage source 36. When the switch 130 closes, a diverting current, greater than or equal to the first stage bias current, flows through the emitter-base junction of the transistor 76 through the current source 128 via the closed switch 130 to the voltage source 36. Because the diverting current is greater than or equal to the first stage bias current, closure of the switch 130 diverts the first stage bias current away from the input stage 10B and the load 24A.

A second input stage 38B, similar to the input stage 10B, has inverting and non-inverting inputs respectively connected to the terminals 42, 40. Additionally, the stage 38B is connected to the terminals 16A, 18A, through signal lines 44A, 46A, respectively, in a manner similar to the connection thereto of the stage 10B. Moreover, like the stage 10B, the stage 38B is connected to the voltage source 29. Additionally the stage 38B is connected to a current source 132 (similar to the current source 120) and a transistor 134 in a manner respectively corresponding to the connection of the stage 10B to the current source 120 and the transistor 84. In a manner similar to current source 120, the current source 132 is connected to the voltage source 36.

The base 136 of the transistor 134 is connected to a current source 138 (similar to the current source 128) through a switch 140 (similar to the switch 130). Like the current source 128, the current source 138 is connected to the voltage source 36. Therefore, the stages 10B, 38B are both operable to provide current to the load 24A.

The load 24A is comprised of transistors 140, 142, which are similar to each other. The respective emitters 144, 146 of the transistors 140, 142 are both connected to the voltage source 36. The respective bases 148, 150 of the transistors 140, 142 and the collector 152 of the transistor 140 are all connected to the terminal 18A through the signal line 28A.

The collector 154 of the transistor 142 is connected to the terminal 16A through the signal line 26A and to an amplifier 156 through a signal line 158.

The load 24A is known as a current mirror. As known to those skilled in the art, the load 24A provides through the line 158 an output difference current that equals the difference between the currents that flow through the signal lines 26A, 28A. In response to the output difference current, the amplifier 156 provides an output voltage.

While the invention has been particularly shown and described with reference to a preferred embodiment thereof, it will be understood by those skilled in the art that various changes may be made in form and detail thereof without departing from the spirit and the scope of the invention.

What is claimed is:

1. Apparatus for selectively providing differential output signals to a load circuit comprising:
   a plurality of differential input stages receiving input signals, all of said input stages coupled to said load circuit, each of said input stages applying differential output signals to said load circuit when a bias current flows through said amplifier stage and said load circuit;
   switching means associated with each of said input stages for providing a bias current to said associated input stage when a switching signal is applied thereto, said bias current also flowing through said load circuit;
   wherein said input stages comprise:
   first and second transistors connected to said load circuit wherein an input signal is a difference between two signals respectively provided to the bases to said transistors;

a first resistor coupled in series with the emitter of said first transistor;

a second resistor coupled in series with the emitter of said second transistor and to said first resistor, said resistors having values that cause the offset voltage of said input stage to be substantially equal to zero; and transistor means in emitter current paths of said first and said second transistors for providing a flow of emitter currents through said transistors and compensating for the temperature dependence of said emitter currents.

2. Apparatus according to claim 1 wherein said emitter currents of said transistors are substantially equal and in accordance with a temperature dependence relationship at all temperatures of interest, said relationship being given as:

$$(Kt/g)\cdot \ln D = Ie1 \cdot \Delta R$$

where:
K is Boltzman's constant;
T is absolute temperature;
Ie1 is the emitter current of the first transistor;
q is the charge of an electron; and
$D = (Ie1/Is1)/(Ie2/Is2)$
where:
Is1 is the saturation current of the base-emitter junction of the first transistor;
Is2 is the saturation current of the base-emitter junction of the second transistor; and
Ie2 is the emitter current of the second transistor.

3. Apparatus according to claim 1 including a pair of transistors, the emitters of said first and second transistors being coupled together via said pair of resistors and the base terminals of said pair of transistors, said pair of transistors coupled to said load circuit for applying said bias current to said load circuit.

4. Apparatus according to claim 3 wherein said switching means comprises:

a diverting current source coupled to said associated input stage, said diverting current source providing a current at least as great as said bias current;

a switch coupled in series with said diverting current source, said bias current being diverted from said associated input stage and said load circuit to said diverting current source in response to closure of said switch.

5. Apparatus according to claim 4 wherein said load circuit comprises a current mirror, each of said input stage including a pair of emitter-coupled transistors coupled as a differential amplifier emitter terminals of each of said transistors coupled through a variable resistor and a biasing transistor to a different terminal of said current mirror, each of said input stages further including a first current source for biasing said biasing transistor, and wherein said switching means includes a fifth transistor coupled to said transistor pair and a switch coupled to said fifth transistor and a second current source.

6. The method of providing differential output signals in response to a selected one of a plurality of differential input signals comprising the steps of:

providing a plurality of input stages, each of said input stages having a pair of transistors with their emitters coupled, said input stages providing differential output signals to a load circuit by means of a bias current flowing through said input stages and said load circuits;

applying said input signals respectively to said input stages; and supplying said bias current to a selected one of said input stages to cause said differential output signals to be provided to said load circuit in response to differential input signals applied to said selected input stage, and causing the offset voltage of said selected input stage to equal zero at substantially all temperatures.

7. The method of providing differential output signals in response to a selected one of a plurality of differential input signals comprising the steps of:

providing a plurality of input stages, each of said input stages having a pair of transistors with their emitters coupled, said input stages providing differential output signals to a load circuit by means of a bias current flowing through said input stage and said load circuit;

applying said input signals respectively to said input stages;

supplying said bias current to a selected one of said input stages to cause said differential output signals to be provided to said load circuit in response to differential input signals applied to said selected input stage; and diverting said bias current from said selected stage when said stage is no longer selected wherein said step of supplying includes the step of supplying a bias current directly proportional to temperature and the additional steps of:

providing a pair of resistors, each of said transistors is coupled in series with one of said emitters; and adjusting said resistors to cause the offset voltage of said stage to be substantially equal to zero when said bias current is supplied thereto.

8. A circuit for providing a differential output signal to a load circuit in response to a differential input signal comprising:

a first transistor connected to said load;

a second transistor connected to said load, the emitters of said transistors being coupled, said input signal being applied to the bases of said transistors, a current source coupled to said first and said second transistor, said current source providing a flow of bias current through said transistors in direct proportion to absolute temperature; and a first resistor connected in series with the emitter of said first transistor; and a second resistor connected in series with the emitter of said second transistor, said resistors having values that cause said output signals to be zero when said input signal is zero at substantially all temperatures.

* * * * *